(12) United States Patent
Kumar

(10) Patent No.: US 7,498,820 B2
(45) Date of Patent: Mar. 3, 2009

(54) METHOD, APPARATUS AND COMPUTER-READABLE CODE FOR DETECTING AN INCIPIENT GROUND FAULT IN AN ELECTRICAL PROPULSION SYSTEM

(75) Inventor: Ajith Kuttannair Kumar, Erie, PA (US)

(73) Assignee: General Electric Company, Schenectady, NY (US)

( * ) Notice: Subject to any disclaimer, the term of this patent is extended or adjusted under 35 U.S.C. 154(b) by 110 days.

(21) Appl. No.: 11/762,312

(22) Filed: Jun. 13, 2007

(65) Prior Publication Data

US 2007/0229091 A1 Oct. 4, 2007

Related U.S. Application Data

(63) Continuation-in-part of application No. 11/385,309, filed on Mar. 21, 2006, now Pat. No. 7,248,057.

(51) Int. Cl.
*G01R 31/14* (2006.01)
*G01R 31/08* (2006.01)
*H02H 3/00* (2006.01)

(52) U.S. Cl. ............... 324/509; 324/512; 361/42

(58) Field of Classification Search .......... 324/509, 324/510, 512, 500, 522, 523; 361/42, 44, 361/45, 49, 67, 78, 87; 73/116; 702/132; 714/25; 123/693
See application file for complete search history.

(56) References Cited

U.S. PATENT DOCUMENTS

| | | | |
|---|---|---|---|
| 3,757,169 A | 9/1973 | Beresnikow | |
| 3,894,272 A | 7/1975 | Bentley | |
| 4,541,031 A | 9/1985 | Ibbetson | |
| 4,827,369 A | 5/1989 | Saletta et al. | |
| 4,837,519 A | 6/1989 | Lopetrone et al. | |
| 5,160,926 A | 11/1992 | Schweitzer, III | |
| 5,282,212 A | 1/1994 | Shah | |
| 5,309,109 A | 5/1994 | Miyazaki et al. | |
| 5,481,194 A | 1/1996 | Schantz et al. | |
| 5,528,445 A * | 6/1996 | Cooke et al. | 361/20 |
| 5,561,380 A | 10/1996 | Sway-Tin et al. | |
| 5,710,777 A | 1/1998 | Gawne | |
| 5,768,079 A | 6/1998 | Buell | |

(Continued)

*Primary Examiner*—Diego Gutierrez
*Assistant Examiner*—Hoai-An D Nguyen
(74) *Attorney, Agent, or Firm*—John Kramer, Esq.; Enrique J. Mora, Esq.; Beusse Wolter Sanks Mora & Maire, P.A.

(57) ABSTRACT

Method, apparatus and computer-readable code for detecting an incipient ground fault. The apparatus includes a sensor for sensing a ground leakage signal. The apparatus further includes a correlator that receives the ground leakage signal, and at least one signal indicative of a respective energization state of a respective electrical phase for each of a plurality of electrical devices. The signal indicative of the respective energization state is modified during a time interval when a predetermined rate of change of voltage is expected. This rate of change is sufficient to cause an effect in the ground leakage signal. The correlator is configured to correlate the ground leakage signal with each received phase energization state signal, and supply a correlation signal. A processor is coupled for processing each of the individual correlation signals and extracting a correlation value from the supplied correlation signals that may be indicative of an incipient ground fault.

16 Claims, 6 Drawing Sheets

U.S. PATENT DOCUMENTS

| | | |
|---|---|---|
| 5,872,457 A | 2/1999 | Williams |
| 5,877,926 A | 3/1999 | Moisin |
| 5,945,802 A | 8/1999 | Konrad et al. |
| 5,946,172 A | 8/1999 | Hansson et al. |
| 5,982,593 A | 11/1999 | Kimblin et al. |
| 5,990,686 A | 11/1999 | Vokey et al. |
| 6,002,563 A | 12/1999 | Esakoff et al. |
| 6,049,143 A | 4/2000 | Simpson et al. |
| 6,081,122 A | 6/2000 | McCary |
| 6,318,160 B1 | 11/2001 | Bessler |
| 6,347,025 B1 | 2/2002 | Ulrich et al. |
| 6,421,618 B1 | 7/2002 | Kliman et al. |
| 6,437,963 B1 * | 8/2002 | Hamilton et al. ............ 361/227 |
| 6,497,182 B2 | 12/2002 | Melpolder et al. |
| 6,735,496 B1 | 5/2004 | Roman |
| 6,829,556 B2 | 12/2004 | Kumar |
| 7,050,279 B2 * | 5/2006 | Nojima ........................ 361/42 |
| 7,102,355 B1 | 9/2006 | Kumar |
| 7,344,202 B2 * | 3/2008 | Linebach et al. ......... 303/113.2 |
| 2003/0184932 A1 | 10/2003 | McNally et al. |
| 2004/0162696 A1 | 8/2004 | Kumar |
| 2006/0255656 A1 | 11/2006 | Linebach et al. |

* cited by examiner

METHOD, APPARATUS AND COMPUTER-READABLE CODE FOR DETECTING AN INCIPIENT GROUND FAULT IN AN ELECTRICAL PROPULSION SYSTEM

This application is a Continuation-In-Part of U.S. patent application Ser. No. 11/385,309 filed Mar. 21, 2006 now U.S. Pat. No. 7,248,057. This application is further related to U.S. patent application Ser. Nos. 11/762,163 and 11/762,216, filed concurrently herewith. Each of the foregoing applications is incorporated by reference herein in their entirety.

FIELD OF THE INVENTION

The present invention is generally related to electrical propulsion systems, and more particularly, to a method, apparatus and computer-readable code for detecting an incipient ground fault that may occur in an electrical propulsion system of a traction vehicle.

BACKGROUND OF THE INVENTION

Locomotives and transit vehicles, as well as other large traction vehicles used for heavy haul applications (off-highway trucks), commonly use an electrical propulsion system that includes various high power electrical components, such as generators, rectifiers, converters, traction motors, dynamic braking grids, cooling blowers, and the like. These components may fail over time due to various reasons, one of them being electrical grounds that may be caused by insulation degradation. For example, locomotives may operate in environments subject to varying conditions, such as causative of freezing and thawing, which can degrade an exposed electrical insulation, resulting in cracks.

The propulsion system of a locomotive has many insulated windings, and excessive leakage current could develop over time due to various factors, such as aging, moisture, abrasions, dirt built-up and the like. This is especially true for the traction motors since moisture often gets into these components because of their location and exposure to relatively harsh environmental conditions. Failures due to excessive electrical leakage currents in an electrical system of locomotives are a leading cause of system shutdowns and locomotive mission failures, similar problems exist in the above-noted vehicles.

Leakage current detectors have been used in many kinds of electrical equipment to protect the equipment from damage that could arise in the presence of a large electrical current and/or to protect personnel from injury, and there may be substantial industrial background on leakage current monitoring by techniques used in electrical utility or industrial applications. Ground faults may occur as a result of a fault in any of a number of different system components. In the context of a locomotive, such components by way of example can include the propulsion drive system, batteries, and auxiliary equipment. Within the propulsion drive system, ground faults can occur in one or several components, which include generator, rectifier, cabling, traction motor, dynamic brake resistor, and blower motor.

A known difficulty in dealing with ground conditions in a locomotive is that many of such conditions may be transitory in nature. Often when a ground fault condition occurs, the affected portion of the electrical system is deactivated, and the locomotive is scheduled for repairs. However, once the locomotive is shopped for repairs, the system may no longer exhibit abnormal grounds and the maintenance personnel cannot identify the source of the fault. This is often because the excessive leakage current is caused by moisture in the electrical components. By the time the locomotive is shopped, the moisture has dried out, thus eliminating the high leakage currents. The amount of moisture that is able to penetrate the insulation system and result in high leakage currents often depends in part on the condition of the insulation system. A properly operating system experiences relatively small change in leakage current as a result of changing moisture conditions, whereas a system with degraded insulation may experience large changes in leakage current that is moisture dependent.

In view of the foregoing considerations, it is desirable to have early warning of leakage current development (i.e., an incipient ground fault) in the electrical propulsion of the locomotive so that action may be taken before there is a locomotive disabling failure. More particularly, it would be desirable that such an action enables continued operation of the locomotive propulsion system so that the locomotive can fulfill a mission and be able to return on its own power to a locomotive service shop for a thorough check and repair.

It would be further desirable to have the ability to determine in real time the specific equipment that causes the incipient ground fault, as that condition occurs, so that service personnel can retrieve at a later time that information and be able to focus on that specific equipment once the locomotive eventually arrives at the service shop, without trying to mimic the environmental conditions that may have contributed to the occurrence of the incipient ground fault or without having to spend valuable resources and time on troubleshooting fault-free equipment.

BRIEF DESCRIPTION OF THE INVENTION

The present invention in one aspect thereof provides an apparatus for detecting an incipient ground fault that may occur in an electrical propulsion system of a traction vehicle. The electrical propulsion system includes a plurality of electrical devices, each individual electrical device being potentially subject to an incipient ground fault in at least one electrical phase thereof. The apparatus may include a sensor configured to sense a respective ground leakage signal associated with a ground of the propulsion system. The apparatus may further include a correlator coupled to the sensor to receive the ground leakage signal, and further coupled to receive at least one signal indicative of a respective energization state of a respective electrical phase for each respective one of the plurality of electrical devices. The at least one signal indicative of the respective energization state of a respective electrical phase is configured to be modified during a time interval when a predetermined rate of change of voltage is expected. This predetermined rate of change of voltage is sufficient to cause an effect in the characteristics of the ground leakage signal. The correlator is configured to individually correlate the ground leakage signal with each received phase energization state signal, and supply an individual correlation signal between the ground leakage signal and each received phase energization state signal. A processor is coupled to the correlator for processing each of the individual correlation signals supplied by the correlator and extract a correlation value from the supplied correlation signals. The correlation value may be indicative of an incipient ground fault, if any, in a respective phase of one of the plurality of electrical devices.

The present invention in another aspect thereof provides a method for detecting an incipient ground fault that may occur in an electrical propulsion system of a traction vehicle. The electrical propulsion system includes a plurality of electrical devices, each individual electrical device being potentially subject to an incipient ground fault in at least one electrical phase thereof. The method allows sensing a respective ground leakage signal associated with a ground of the propulsion system. The method further allows monitoring at least one signal indicative of a respective energization state of a respective electrical phase for each respective one of the electrical devices and modifying such at least one signal indicative of the respective energization state during a time interval when a predetermined rate of change of voltage is expected. This predetermined rate of change of voltage is sufficient to cause an effect in the characteristics of the ground leakage signal. The ground leakage signal is individually correlated with each modified phase energization state signal. An individual correlation signal is generated between the ground leakage signal and each modified phase energization state signal, and a correlation value is determined from the generated correlation signals. The correlation value may be indicative of an incipient ground fault, if any, in a respective phase of one of the plurality of electrical devices.

The present invention in yet another aspect thereof provides an article of manufacture comprising a computer program product comprising a computer-usable medium having a computer-readable code therein for detecting an incipient ground fault that may occur in an electrical propulsion system of a traction vehicle. The electrical propulsion system includes a plurality of electrical devices, each individual electrical device being potentially subject to an incipient ground fault in at least one electrical phase thereof. The computer-readable code includes: computer-readable code responsive to a sensed ground leakage signal associated with a ground of the propulsion system; computer-readable code for monitoring at least one signal indicative of a respective energization state of a respective electrical phase for each respective one of the electrical devices; computer-readable code for modifying the at least one signal indicative of the respective energization state during a time interval when a predetermined rate of change of voltage is expected. This predetermined rate of change of voltage is sufficient to cause an effect in the characteristics of the ground leakage signal; computer-readable code for individually correlating the ground leakage signal with each modified phase energization state signal; computer-readable code for generating an individual correlation signal between the ground leakage signal and each modified phase energization state signal; and computer-readable code for determining a correlation value from the generated correlation signals. The correlation value may be indicative of an incipient ground fault, if any, in a respective phase of one of the plurality of electrical devices.

BRIEF DESCRIPTION OF THE DRAWINGS

These and other advantages of the invention will be more apparent from the following description in view of the drawings that show.

DETAILED DESCRIPTION OF THE INVENTION

Figure 1:
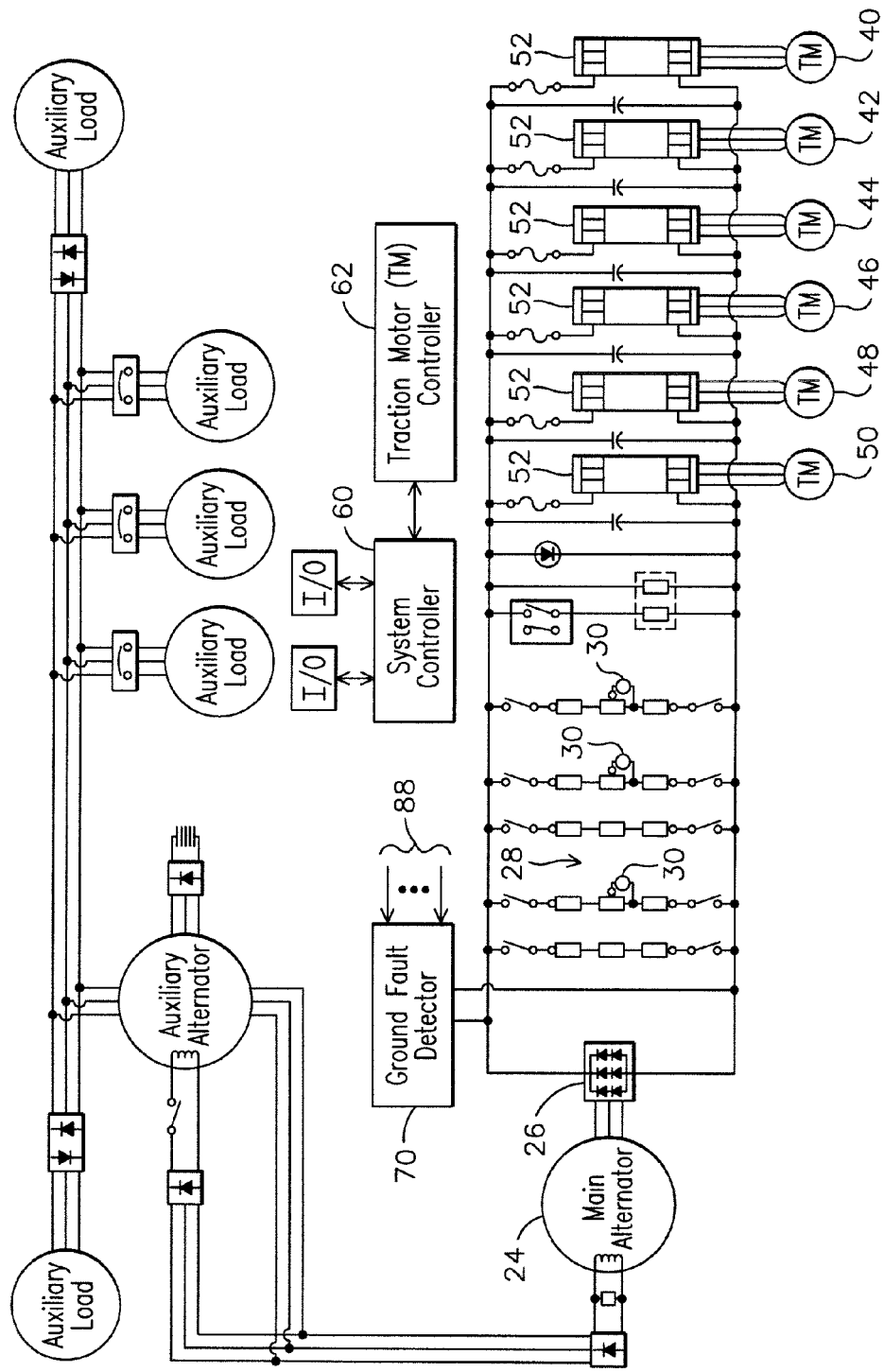
FIG. 1 is a schematic of one exemplary locomotive propulsion system.
Figure 2:
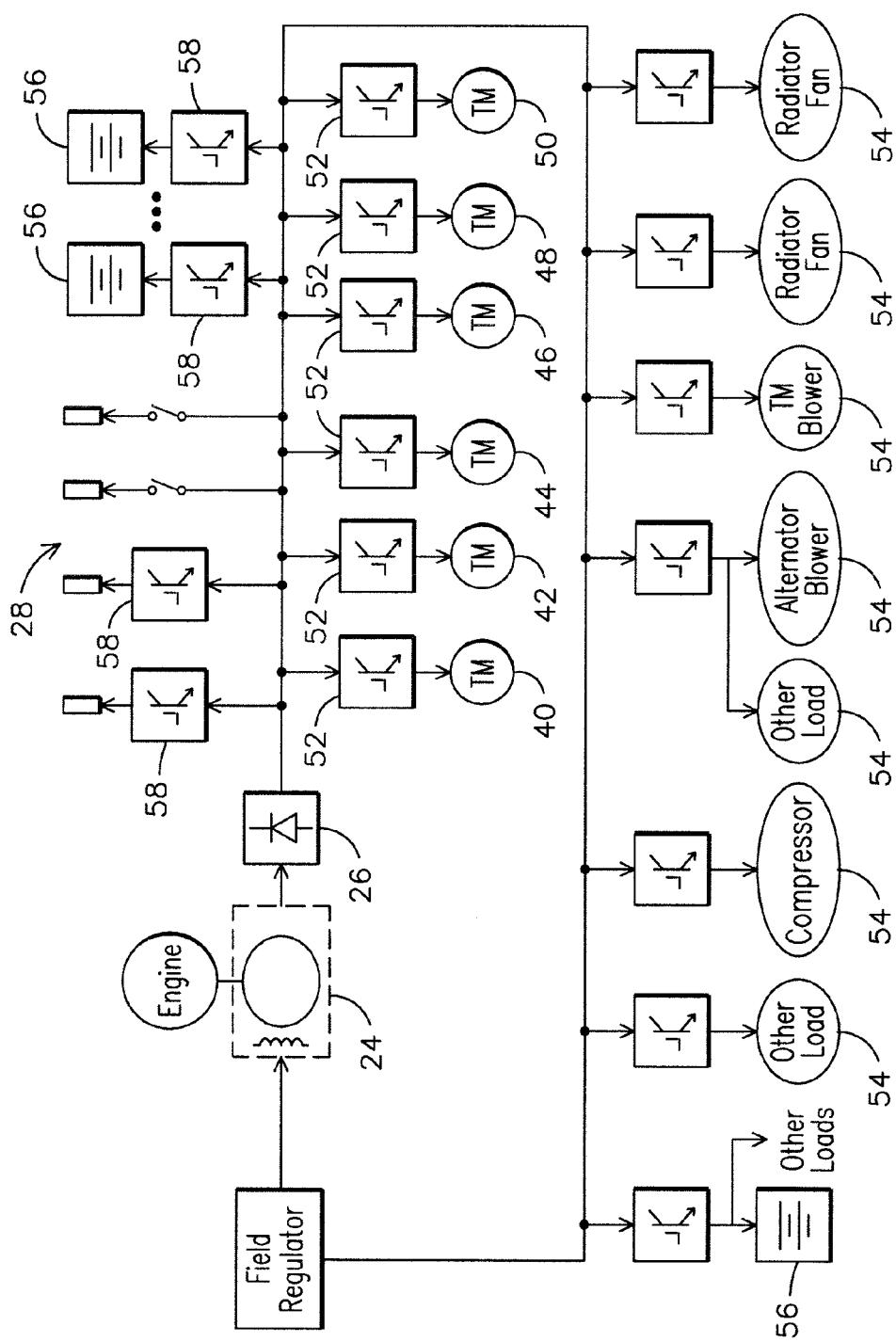
FIG. 2 is a schematic of another exemplary locomotive propulsion system.

FIG. 1 is a simplified schematic of one exemplary propulsion system in a traction vehicle, such as a locomotive, a transit vehicle, or any other large traction vehicle as may be used for heavy haul applications (e.g., off-highway trucks). In one example embodiment, the propulsion system includes a plurality of electrical devices that individually may be potentially subject to an incipient ground fault in at least one electrical phase thereof. Examples of such devices may include an alternator 24, a main rectifier 26, and a dynamic braking grid 28, which may include blowers 30. Further, illustrated in FIG. 1 are six traction motors 40, 42, 44, 46, 48, and 50, where each motor may be electrically connected to a respective inverter 52. As illustrated in FIG. 2 in connection with another example of a locomotive propulsion system 20, the electrical devices may further comprise various other electrical devices, such as various types of auxiliary electrical loads 54, energy storage devices 56 (e.g., batteries) as may be used in a hybrid vehicle, DC voltage step-up/step-down devices 58 (e.g., choppers), etc.

Returning to FIG. 1, the propulsion system may further include a propulsion system controller 60, a traction motor controller 62, and a ground fault detector 70 embodying aspects of the present invention. By way of example, a ground fault detector embodying aspects of the present invention will enable to detect essentially in real time (e.g., in the order of milliseconds) and with a single sensor the location of an incipient ground fault (i.e., a leakage current which if not quickly interrupted could result in a vehicle-disabling failure). The detection technique is performed without interrupting operation of the electrical devices that make up the propulsion system, and consequently there is virtually no degradation in the operational performance of the propulsion system.

Figure 3:
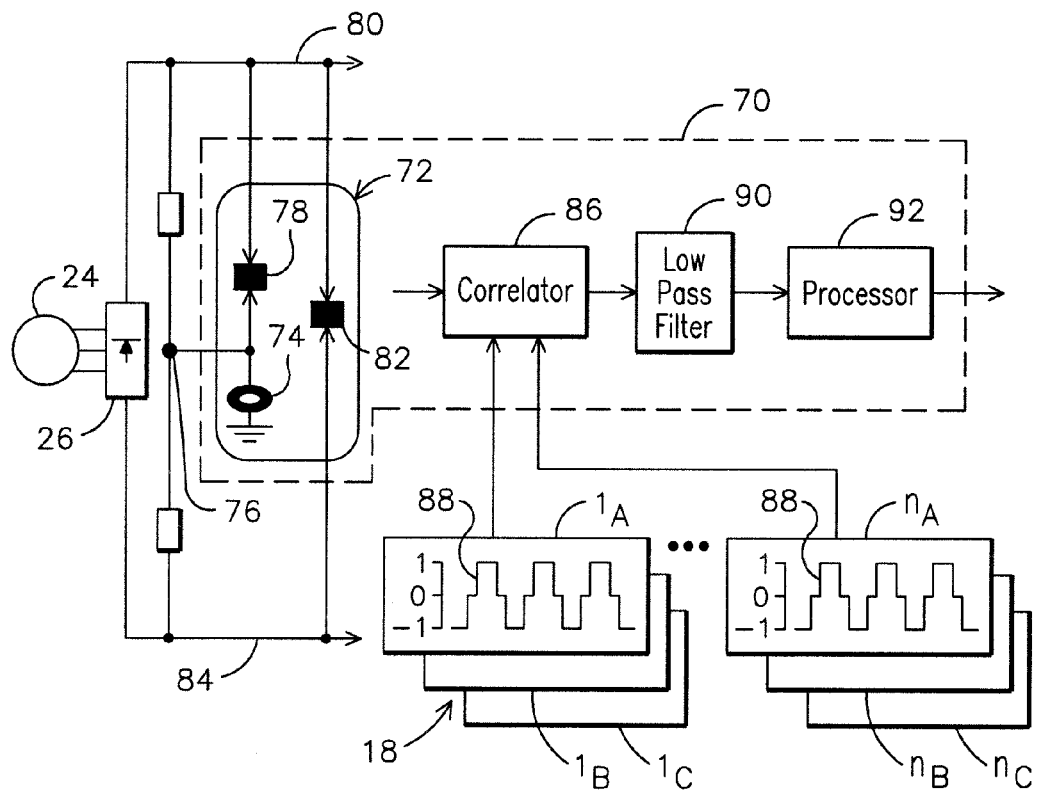
FIG. 3 illustrates circuit details regarding an exemplary ground fault detector embodying aspects of the present invention.

FIG. 3 illustrates details regarding an exemplary ground fault detector 70 that may include a sensor 72 configured to sense a respective ground leakage signal associated with a ground of the propulsion system. In one example, sensor 72 may comprise a current sensor 74 connected at an electrically neutral node 76, and may further comprise one or more voltmeters, such as a voltmeter 78 connected between a positive side 80 of a direct current (DC) bus and node 76, and/or a voltmeter 82 connected across the positive side 80 and a negative side 84 of the DC bus.

A correlator 86 is coupled to the sensor 72 to receive the ground leakage signal, and is further coupled to receive at least one signal 88 indicative of a respective energization state of a respective electrical phase for each respective one of the electrical devices. Each signal 88 is configured to be modified during a time interval when a predetermined rate of change of voltage is expected. This predetermined rate of change of voltage is sufficient to cause an effect in the characteristics of the ground leakage signal (e.g., may cause a spike in the magnitude of the leakage current). In one example embodiment the modification comprises masking (e.g., zeroing) each signal 88 during the time interval when the high rate of change of voltage is expected, such as during a transition from one energization state to another energization state. For example, transitioning from a positive voltage (e.g., +700 V) present in the positive side of the DC bus to a negative voltage (−700 V) present in the negative side of the DC bus or vice versa.

Figure 7:
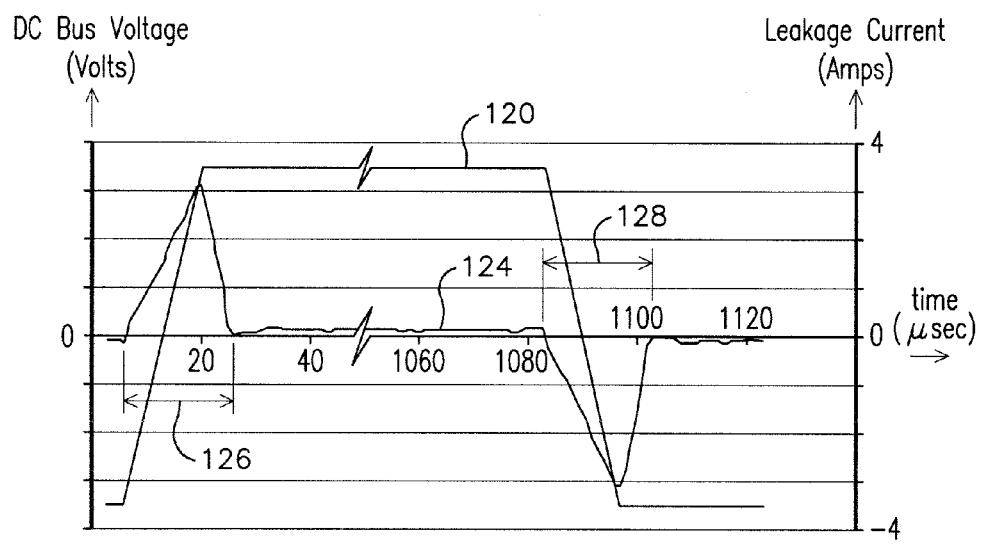
FIGS. 7 and 8 show example waveforms as may develop in a prior art apparatus for detecting an incipient ground fault.
Figure 8:
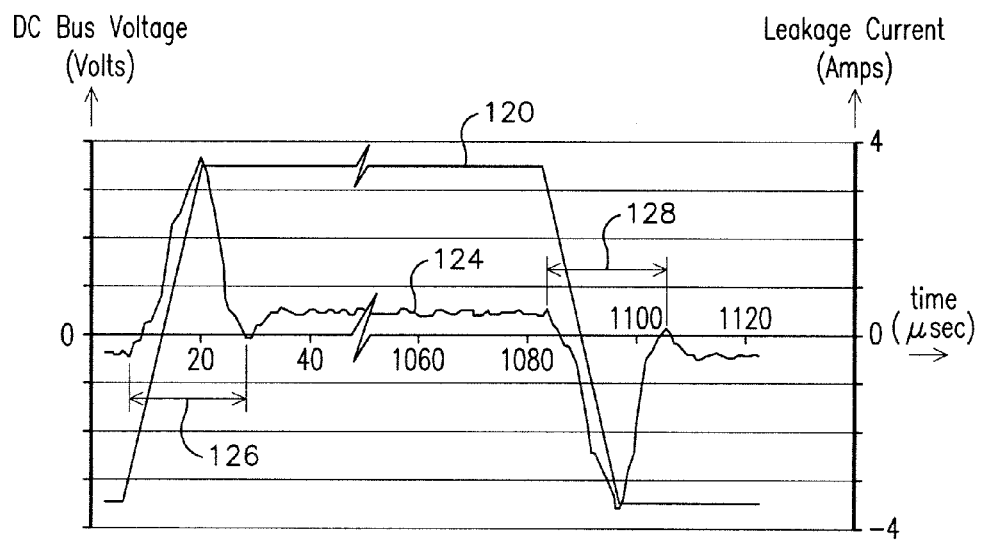

FIG. 7 is a plot of example waveforms as may develop in a prior art apparatus for detecting an incipient ground fault that may occur in an electrical propulsion system of a traction vehicle. Waveform 120 represents voltage across a respective phase winding and waveform 124 represents ground leakage current within acceptable levels in FIG. 7, and showing an incipient ground fault in FIG. 8. Note that during time intervals 126 and 128 when the predetermined rate of change of voltage occurs (e.g., a relatively high rate of change of voltage) in waveform 120, there is a noticeable effect on the characteristics of the ground leakage current, which can impair accurate and/or consistent detection of the incipient ground fault. As will be appreciated by one skilled in the art, these transient spikes can have a significantly higher magnitude of current relative to the magnitude of the leakage current (when the transients are not present), and thus, even a relatively small percentage error that can be introduced while processing the leakage current during time intervals 126 and 128, can result in an unacceptable level of uncertainty for detecting the incipient ground fault.

Figure 9:
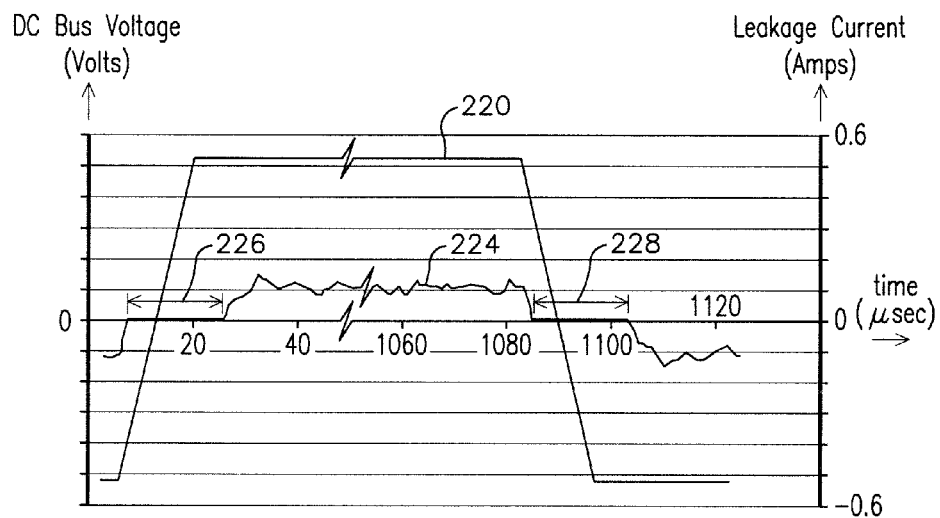
FIGS. 9 and 10 show example waveforms as may develop in an apparatus embodying aspects of the present invention for detecting an incipient ground fault that may occur in an electrical propulsion system of a traction vehicle.
Figure 10:
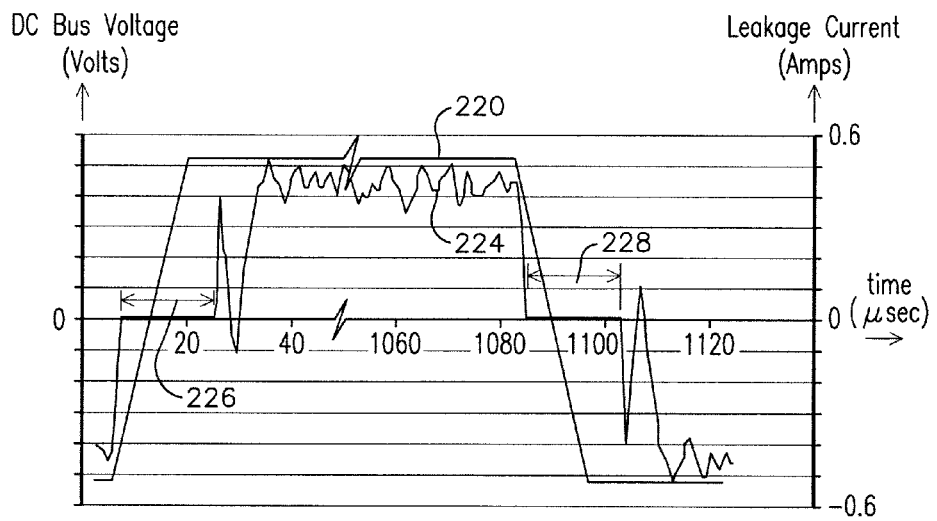

FIG. 9 is a plot of example waveforms as may develop in apparatus embodying aspects of the present invention for detecting an incipient ground fault that may occur in an electrical propulsion system of a traction vehicle. Waveform 220 represents voltage across a respective phase winding and waveform 224 represents ground leakage current, within acceptable levels in FIG. 9, and showing an incipient ground fault in FIG. 10. Note that during time intervals 226 and 228 when the predetermined rate of change of voltage (high dv/dt) is expected in waveform 220, a masking action performed in accordance with aspects of the present invention allows removing undesirable effects on the characteristics of the ground leakage current, and this advantageously results in a more accurate and/or consistent detection of the incipient ground fault. For example, it is seen that in FIG. 9 and in FIG. 10 that during time intervals 226 and 228, the leakage current is free from spikes that can impair accurate and/or consistent detection of the prior art apparatus for detecting an incipient ground fault.

Each signal 88 provides an indication of whether the electrical phase of a respective one of the electrical devices is connected to a respective side of the DC bus. For example, block $1_A$ represents a signal indicative of the respective energization state of a first electrical phase (e.g., phase A) for a first one of the electrical devices. In this example, block $1_B$ represents a signal indicative of the respective energization state of a second electrical phase (e.g., phase B) for the first of the electrical devices and block $1_C$ represents a signal indicative of the respective energization state of a third electrical phase (e.g., phase C) for the first of the electrical devices. Similarly, block $n_A$ represents a signal indicative of the respective energization state of a first electrical phase (e.g., phase A) for an nth one of the electrical devices. In this example, block $n_B$ represents a signal indicative of the respective energization state of a second electrical phase (e.g., phase B) for the nth of the electrical devices and and block $n_C$ represents a signal indicative of the respective energization state of a third electrical phase (e.g., phase C) for the nth of the electrical devices. Examples of a signal 88 may be a phase firing signal such as the firing signal applied to a power switching device, such as an Insulated Gate Bipolar Transistor (IGBT) in a given inverter 52, or may be a voltage signal, such as the voltage that is developed across the phase of a given electrical device with respect to the positive (or the negative) side of the DC bus connected to the inverter, or may be a phase current signal, such as the current that flows through the phase of a given electrical device, or may be the current that flows through the switching device such as an IGBT, or may be a combination of the foregoing signals. For example in the case of a diode rectifier 26 connected between the alternator and the DC bus, the state of diode conduction (and hence whether the phase is connected to the positive or negative side of the DC bus) may be determined from the direction of current flowing in the phase. Similarly, when there is current flowing in the positive A phase diode, for example, then this indicates that phase A is connected to DC positive bus.

Correlator 86 is configured to individually correlate the ground leakage signal with each received phase energization state signal 88, and supply an individual correlation (e.g., temporal interdependence) signal between the ground leakage signal and each received phase energization state signal. One example of correlator 86 is a multiplier device. That is, a device that multiplies the ground leakage signal from sensor 72 with each received phase energization state signal 88. In one example embodiment the multiplier value is set to zero during the time interval when the predetermined rate of change of voltage is expected, such as during a transition from one energization state to another energization state. Outside this time interval the multiplier value may be equal to unity, and may include a positive or a negative sign depending on the applicable energization state, as indicated in the example representations of energization state signal 88 shown in FIG. 3. It will be appreciated that setting the multiplier value to zero during the time interval when the predetermined rate of change of voltage is expected is one example of how one can perform the masking action that allows to remove the relatively high magnitude spikes that can impair accurate and/or consistent detection of the prior art apparatus for detecting an incipient ground fault.

A filter 90, such a low pass filter, may be coupled to the correlator 86 to provide a predefined filtering to the supplied correlation signals. This would enable to extract a DC (or low frequency) content from the correlation signal, such as may be present in an incipient DC fault ground. A processor 92 may be coupled to the filter 90 for processing each of the filtered correlation signals and extract a correlation value from the filtered correlation signals. The correlation value to be extracted may be determined based on a comparison of the respective values of the correlation signals with respect to a predefined threshold value. For example, the extracted value may correspond to the correlation signal that exceeds the threshold value. This extracted correlation value, if any, is indicative of an incipient ground fault in a respective phase of one of the plurality of electrical devices. That is, this extracted value would indicate a strong temporal (time) interdependence or association between the ground leakage signal and the moment in time when a given electrical phase of a given electrical device is connected to the DC bus. It is noted that, as the correlation operation is performed, a temporarily shift in frequency or phase may be applied to the signals indicative of the respective energization state of the electrical phases of a given electrical device. This would allow locating ground faults that may occur in different phases of the same electrical device. Otherwise such multiple faults could be masked due to, for example, synchronicity between the phases of the firing signals.

It is noted that for the sake of simplicity of illustration FIG. 3 just shows one correlator and one low pass filter associated with a single signal 88. In the general case, assuming a number of m signals 88 (where m is a positive integer larger than one) one would employ a number of m correlators and m low pass filters, in lieu of the single correlator and filter shown in FIG. 3. For example, assuming six three-phase electrical devices, then m=6×3=18.

Figure 4:
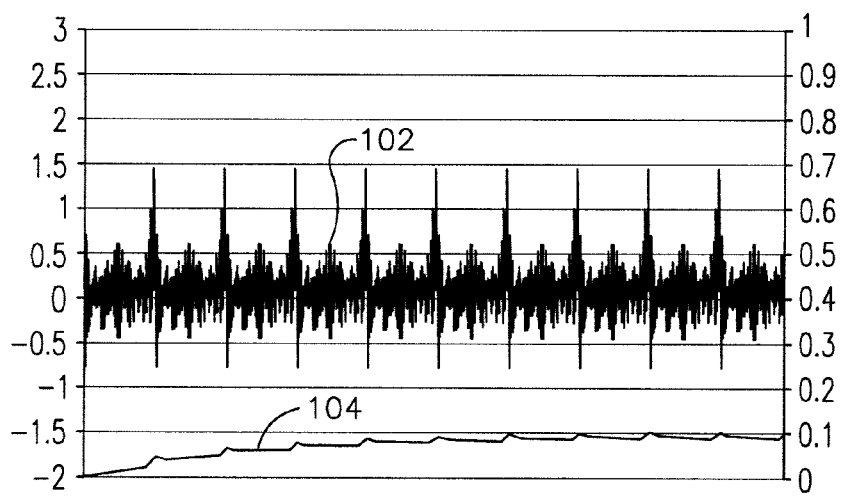
FIGS. 4-6 show graphical plots of exemplary test results of an apparatus for detecting an incipient ground fault in accordance with aspects of the present invention.
Figure 5:
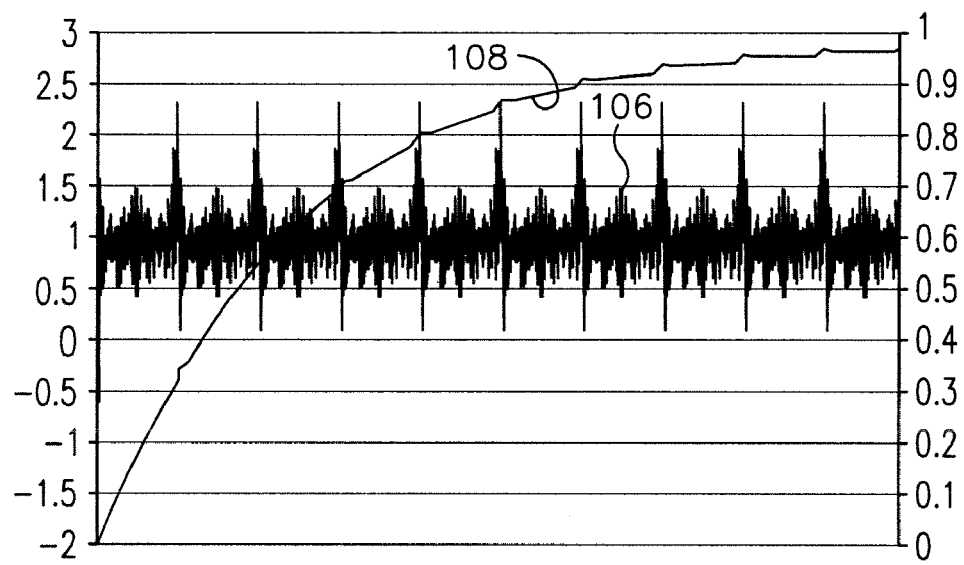
Figure 6:
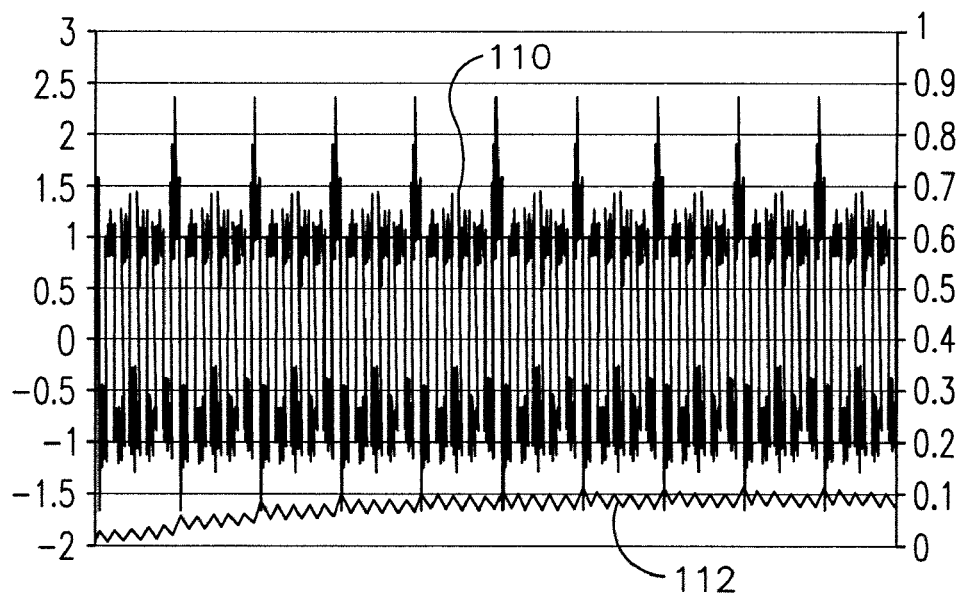

FIGS. 4-6 show graphical plots as a function of time of exemplary test results of an apparatus for detecting an incipient ground fault in accordance with aspects of the present invention. More particularly, FIG. 4 illustrates a non-fault ground condition in the propulsion system where, for example, a signal plot 102 (left vertical scale) corresponds to the ground leakage signal and a signal plot 104 (right vertical scale) corresponds to a correlated output signal.

By way of comparison, FIG. 5 illustrates an incipient ground fault being detected in a given electrical phase of a given electrical device. For example, the signal plot 106 (left vertical scale) illustrates a DC content in the ground leakage signal and a signal plot 108 (right vertical scale) illustrates a fast and measurable transient (in the order of a second or less, thereby demonstrating a desirable characteristic of a detector embodying aspects of the present invention) in the correlated output signal.

FIG. 6 illustrates exemplary signal plots in a given electrical device during the presence of an incipient ground fault in the electrical phase of another electrical device. A signal plot 110 (left vertical scale) illustrates a ground leakage signal similar to the one shown in FIG. 4 during a no ground fault condition. Similarly, a signal plot 112 (right vertical scale) for the correlated output signal of the electrical device without the incipient ground fault shows no evidence of a fault condition, thereby demonstrating that an apparatus for detecting an incipient ground fault in accordance with aspects of the present invention is substantially impervious to cross-coupling effects due to ground fault conditions present in other electrical devices while monitoring a given electrical device.

Aspects of the present invention can be embodied in the form of computer-implemented processes and apparatus for practicing those processes. The present invention can also be embodied in the form of computer program code including computer-readable instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. When implemented on a computer, the computer program code segments configure the computer to create specific logic circuits or processing modules.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

The invention claimed is:

1. Apparatus for detecting an incipient ground fault that may occur in an electrical propulsion system of a traction vehicle, said electrical propulsion system comprising a plurality of electrical devices, each individual electrical device being potentially subject to an incipient ground fault in at least one electrical phase thereof, said apparatus comprising:
   a sensor configured to sense a ground leakage signal associated with a ground of the propulsion system;
   a correlator coupled to the sensor to receive the ground leakage signal, and further coupled to receive at least one signal indicative of a respective energization state of a respective electrical phase for each respective one of the plurality of electrical devices, wherein said at least one signal indicative of the respective energization state of a respective electrical phase is configured to be modified during a time interval when a predetermined rate of change of voltage is expected, said predetermined rate of change of voltage being sufficient to cause an effect in the characteristics of the ground leakage signal, said correlator configured to individually correlate the ground leakage signal with each received phase energization state signal and supply an individual correlation signal between the ground leakage signal and each received phase energization state signal; and
   a processor coupled to the correlator for processing each of the individual correlation signals supplied by the correlator and extracting a correlation value from the supplied correlation signals, said correlation value being indicative of an incipient ground fault, if any, in a respective phase of one of the plurality of electrical devices.

2. The apparatus of claim 1 wherein the modification of said at least one signal comprises masking said at least one signal during the time interval.

3. The apparatus of claim 1 wherein the expectation of the predetermined rate of change of voltage corresponds with a transition from one energization state to another energization state.

4. The apparatus of claim 1 wherein the signal indicative of the respective energization state of the electrical phase of a respective electrical device is selected from the group consisting of a phase firing signal, a voltage signal with respect to a direct current (DC) bus, a phase current signal, a current that flows through a power switching device connected to the DC bus, and a combination of the foregoing signals.

5. The apparatus of claim 1 further comprising a low pass filter connected to the correlator and configured to provide a predefined filtering to the supplied correlation signals.

6. The apparatus of claim 1 wherein the sensor configured to sense the respective ground leakage signal is selected from the group consisting of a current sensor, and at least one or more voltage sensors.

7. The apparatus of claim 1 wherein the traction vehicle is selected from the group consisting of a locomotive, a transit vehicle, and an off-highway vehicle.

8. The apparatus of claim 1 wherein the correlator comprises a multiplier.

9. The apparatus of claim 1 wherein said correlator comprises a plurality of m correlators, each of said m correlators being individually connected to receive one signal indicative of a respective energization state of a respective electrical phase of one of the plurality of electrical devices, wherein m is a positive integer corresponding to the number of electrical devices times the number of electrical phases per device.

10. The apparatus of claim 5 wherein said correlator comprises a plurality of m correlators, each of said m correlators being individually connected to receive one signal indicative of a respective energization state of a respective electrical phase of one of the plurality of electrical devices, wherein m is a positive integer corresponding to the number of electrical devices times the number of electrical phases per device, and further wherein said low pass filter comprises a plurality of m low pass filters, each one of said m filters being individually connected to one of said m correlators to provide a predefined filtering to one supplied correlation signal.

11. A method for detecting an incipient ground fault that may occur in an electrical propulsion system of a traction vehicle, said electrical propulsion system comprising a plurality of electrical devices, each individual electrical device being potentially subject to an incipient ground fault in at least one electrical phase thereof, said method comprising:

sensing a ground leakage signal associated with a ground of the propulsion system;

monitoring at least one signal indicative of a respective energization state of a respective electrical phase for each respective one of the electrical devices;

modifying said at least one signal indicative of the respective energization state during a time interval when a predetermined rate of change of voltage is expected, said predetermined rate of change of voltage being sufficient to cause an effect in the characteristics of the ground leakage signal;

individually correlating the ground leakage signal with each modified phase energization state signal;

generating an individual correlation signal between the ground leakage signal and each modified phase energization state signal; and determining a correlation value from the generated correlation signals, said correlation value being indicative of an incipient ground fault, if any, in a respective phase of one of the plurality of electrical devices.

12. The method of claim 11 wherein the modifying of said at least one signal comprises masking said at least one signal during the time interval.

13. The method of claim 11 wherein the expectation of the predetermined rate of change of voltage corresponds with a transition from one energization state to another.

14. An article of manufacture comprising a computer program product comprising a computer-usable medium having a computer-readable code therein for detecting an incipient ground fault that may occur in an electrical propulsion system of a traction vehicle, said electrical propulsion system comprising a plurality of electrical devices, each individual electrical device being potentially subject to an incipient ground fault in at least one electrical phase thereof, said computer-readable code comprising:

computer-readable code responsive to a sensed ground leakage signal associated with a ground of the propulsion system;

computer-readable code for monitoring at least one signal indicative of a respective energization state of a respective electrical phase for each respective one of the electrical devices;

computer-readable code for modifying said at least one signal indicative of the respective energization state during a time interval when a predetermined rate of change of voltage is expected, said predetermined rate of change of voltage being sufficient to cause an effect in the characteristics of the ground leakage signal;

computer-readable code for individually correlating the ground leakage signal with each modified phase energization state signal;

computer-readable code for generating an individual correlation signal between the ground leakage signal and each modified phase energization state signal; and computer-readable code for determining a correlation value from the generated correlation signals, said correlation value being indicative of an incipient ground fault, if any, in a respective phase of one of the plurality of the electrical devices.

15. The article of manufacture of claim 14 wherein the computer-readable code for modifying said at least one signal comprises computer-readable code for masking said at least one signal during the time interval.

16. The article of manufacture of claim 14 wherein the expectation of the predetermined rate of change of voltage corresponds with a transition from one energization state to another energization state.

* * * * *